United States Patent
Chung et al.

(10) Patent No.: US 9,412,729 B2
(45) Date of Patent: Aug. 9, 2016

(54) SEMICONDUCTOR PACKAGE AND FABRICATING METHOD THEREOF

(71) Applicant: Amkor Technology, Inc., Chandler, AZ (US)

(72) Inventors: Ji Young Chung, Seongnam-si (KR); Choon Heung Lee, Seoul (KR); Glenn Rinne, Apex, NC (US); Byong Jin Kim, Bucheon-si (KR)

(73) Assignee: Amkor Technology, Inc., Tempe, AZ (US)

( * ) Notice: Subject to any disclaimer, the term of this patent is extended or adjusted under 35 U.S.C. 154(b) by 94 days.

(21) Appl. No.: 14/456,226

(22) Filed: Aug. 11, 2014

(65) Prior Publication Data
US 2015/0041975 A1  Feb. 12, 2015

(30) Foreign Application Priority Data
Aug. 12, 2013  (KR) .................. 10-2013-0095624

(51) Int. Cl.
| | |
|---|---|
| H01L 23/02 | (2006.01) |
| H01L 25/00 | (2006.01) |
| H01L 23/498 | (2006.01) |
| H01L 25/065 | (2006.01) |
| H01L 25/10 | (2006.01) |
| H01L 23/31 | (2006.01) |

(52) U.S. Cl.
CPC .......... *H01L 25/50* (2013.01); *H01L 23/49811* (2013.01); *H01L 25/0657* (2013.01);
(Continued)

(58) Field of Classification Search
CPC ... H01L 25/50; H01L 25/105; H01L 25/0657; H01L 23/49811; H01L 23/3128; H01L 23/49816; H01L 2224/16225; H01L 2224/48091; H01L 2224/3225; H01L 2224/73265; H01L 2224/48227; H01L 2224/73204; H01L 2224/32145

USPC ......... 257/685–686, 737–738, 787–788, 790, 257/666, 777, 778
See application file for complete search history.

(56) References Cited

U.S. PATENT DOCUMENTS

| | | | |
|---|---|---|---|
| 8,148,807 | B2 | 4/2012 | Lee et al. |
| 2006/0220209 | A1 | 10/2006 | Karnezos et al. |
| 2007/0221978 | A1 | 9/2007 | Tsuji |

(Continued)

FOREIGN PATENT DOCUMENTS

| | | |
|---|---|---|
| KR | 2007-0068441 A | 6/2007 |
| KR | 2011-0036978 A | 4/2011 |

(Continued)

OTHER PUBLICATIONS

Taiwanese Official Letter and Search Report of Taiwan Patent Application No. 103127586 dated Jan. 18, 2016 (7 pages).

(Continued)

*Primary Examiner* — Hoa B Trinh
(74) *Attorney, Agent, or Firm* — McAndrews, Held & Malloy, Ltd.

(57) ABSTRACT

A semiconductor package includes a first package comprising a circuit board and a first semiconductor die mounded on the circuit board, and a second package comprising a mounting board. At least one second semiconductor die may be mounted on the mounting board, and one or more leads may be electrically connected to the mounting board and/or the second semiconductor die. An adhesion member may bond the first package to the second package, and an encapsulant may encapsulate the first package and the second package. the circuit board, the mounting board, and the one or more leads may be arranged to surround the first semiconductor die and the second semiconductor die, and the plurality of leads may be electrically connected to the circuit board and to a constant potential or ground, to reduce the effects of external electromagnetic interference upon the semiconductor package.

20 Claims, 5 Drawing Sheets

(52) U.S. Cl.
CPC ........... *H01L25/105* (2013.01); *H01L 23/3128* (2013.01); *H01L 23/49816* (2013.01); *H01L 2224/16225* (2013.01); *H01L 2224/48091* (2013.01); *H01L 2924/19107* (2013.01)

(56) References Cited

U.S. PATENT DOCUMENTS

2013/0043940 A1   2/2013  Herbert et al.
2016/0035664 A1*  2/2016  We ................... H01L 23/49838
                                                                                           257/686

FOREIGN PATENT DOCUMENTS

| KR | 2013-0040071 A | 4/2013 |
|---|---|---|
| TW | 200707669 A | 2/2007 |
| TW | 201310603 A | 3/2013 |

OTHER PUBLICATIONS

Korean Office Action of the Korean Patent Application No. 10-2013-0095624 (5 pages).

* cited by examiner

SEMICONDUCTOR PACKAGE AND FABRICATING METHOD THEREOF

CROSS-REFERENCE TO RELATED APPLICATIONS/INCORPORATION BY REFERENCE

The present application makes reference to, claims priority to, and claims the benefit of Korean Patent Application No. 10-2013-0095624, filed on Aug. 12, 2013, the contents of which is hereby incorporated herein by reference, in its entirety.

FIELD

The present disclosure relates to a semiconductor package and a fabricating method thereof.

BACKGROUND

Semiconductor packages are used in a wide variety of products. There is an ongoing interest in semiconductor packages that are lighter, smaller, and thinner for use in a variety of products.

Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

A semiconductor package and a method of fabricating such a semiconductor package, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

DETAILED DESCRIPTION

Figure 1:
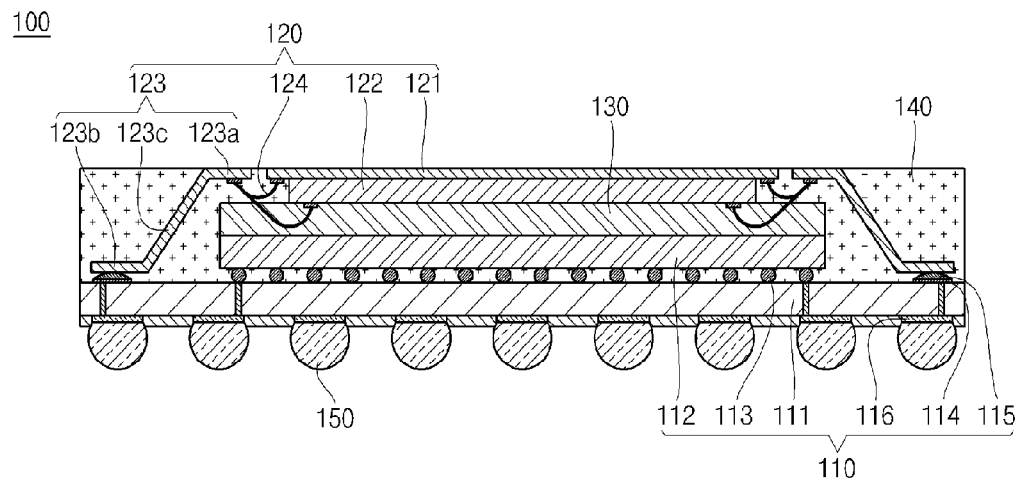
FIG. 1 is a cross-sectional view of an example semiconductor package according to an embodiment of the present disclosure.

Aspects of the present disclosure relate to a semiconductor die package and a method of manufacturing thereof. More specifically, representative embodiments of the present disclosure relate to a semiconductor die package and a method of manufacturing such a semiconductor die package, in which a first package comprising a first semiconductor die and a circuit board is bonded to a mounting board comprising a second semiconductor die and a plurality of leads electrically connected to the mounting board. The mounting board, the circuit board, and the plurality of leads may be arranged to surround the first semiconductor die and the second semiconductor die, and may connect to the circuit board.

Various aspects of the present disclosure will be described in more detail with reference to the accompanying drawings. Those skilled in the art will easily realize various aspects of the present disclosure upon reading the present patent application.

It should be noted that the thickness or size of each the illustrated elements may be exaggerated for clarity in the accompanying drawings, and that like reference numerals may refer to like elements. Additionally, the term "semiconductor die" in this specification includes, for example, a semiconductor chip having an active circuit and/or a passive circuit, a semiconductor wafer, or suitable equivalents thereof, and other devices such as, by way of example and not limitation, micro-electromechanical system (MEMS) devices and/or integrated passive devices (IPD) that may not involve the use of a semiconductor material.

As utilized herein, the term "exemplary" means serving as a non-limiting example, instance, or illustration. Also, as utilized herein, the term "representative" means serving as a non-limiting example, instance, or illustration.

The following discussion may at times utilize the phrase "A and/or B." Such phrase should be understood to mean just A, or just B, or both A and B. Similarly, the phrase "A, B, and/or C" should be understood to mean just A, just B, just C, A and B, A and C, B and C, or all of A and B and C.

Hereinafter, examples of embodiments of the present disclosure will be described in detail with reference to the accompanying drawings such that they can easily be made and used by those skilled in the art. Like numbers may refer to like elements throughout. In addition, when it is said that an element is electrically coupled to another element, it will be understood that these elements may be directly coupled to each other and may be coupled to each other with another element interposed therebetween.

Hereinafter, the embodiments of the present disclosure will be described in detail with reference to the accompanying drawings. In the following description, well-known functions or constitutions will not be described in detail if they would obscure the subject matter of the present disclosure in unnecessary detail. Further, the terminologies to be described below are defined in consideration of functions in the present disclosure and may vary depending on intentions or practices of a user or an operator. Accordingly, the definition may be made on a basis of the content throughout the specification.

Semiconductor packages are used in a wide variety of products. There is an ongoing interest in semiconductor packages that are lighter, smaller, and thinner for use in a variety of devices and systems. A semiconductor package, such as, for example, a "flip-chip" type package having solder bumps directly formed on a surface of a semiconductor die, or a "TSV" package having a "through-silicon-via" formed on a bond pad of a semiconductor die may be used. The "flip-chip" package and the "TSV" package may be configured to include a redistribution layer (RDL) connected to one or more bond pads of the semiconductor die and redistributing portions.

FIG. 1 is a cross-sectional view of an example semiconductor package according to an embodiment of the present disclosure.

Referring to the example of FIG. 1, a semiconductor package 100 according to an embodiment of the present disclosure may include a first package 110 including a circuit board 111 and a first semiconductor die 112 mounted on the circuit board 111; and a second package 120 including a mounting board 121, one or more second semiconductor die 122 mounted on the mounting board 121, and one or more leads 123 electrically connected via wires 124 to the mounting board 121 and the second semiconductor die 122. The example semiconductor package of FIG. 1 also shows an adhesion member 130 bonding the first package 110 to the second package 120. In addition, the first and second packages 110, 120 may be encapsulated by an encapsulant 140 that exposes surfaces of the circuit board 111 and the mounting board 121 that are opposite the surfaces on which the first and second semiconductor die 112, 122 are respectively mounted. In addition, a plurality of conductive members 150 that may, by way of example and not limitation, be in the shape of a ball, and may comprise a solder material, may be formed on the circuit board 111.

As illustrated in the example of FIG. 1, the first package 110 includes the circuit board 111 and the first semiconductor die 112. A first plurality of conductive patterns may be formed on the circuit board 111 and a plurality of conductive bumps 113 may electrically connect the first semiconductor die 112 to the first plurality of conductive patterns. The first semiconductor die 112 may be made of, by way of example and not limitation, a silicon material, and may include a plurality of semiconductor devices formed therein. It should be noted that although reference is made to "semiconductor die" in the present discussion of first semiconductor die 112 and second semiconductor die 122 of FIG. 1, and similarly throughout the examples of the present application, this does not represent a specific limitation of the present disclosure, as other elements such as, by way of example and not limitation, one or more micro-electromechanical system (MEMS) devices or integrated passive devices (IPD) may be present in locations in which a semiconductor die is described. A second plurality of conductive patterns may be formed in the first semiconductor die 112. The circuit board 111 and the first semiconductor die 112 may be electrically interconnected via the conductive bumps 113. One or more bond pads 114 may be formed along one or more edges of the circuit board 111, and an electrically conductive material 115 such as, for example, a solder material, may be coated thereon and electrically interconnect the bond pads 114 to leads 123, to be described in additional detail later. In addition, a redistribution layer (RDL) 116 electrically connected to the first plurality of conductive patterns and the bond pads 114, may be formed on the exposed surface of the circuit board 111.

As shown in the example of FIG. 1, the second package 120 includes a mounting board 121, one or more second semiconductor die 122, and one or more leads 123. In addition, the second package 120 is formed such that the second semiconductor die 122 is stacked over the first semiconductor die 112. The mounting board 121 may be bonded to the second semiconductor die 122 by, for example, an adhesive layer (not shown). The mounting board 121 may comprise a conductor or an insulator. In some representative embodiments, the mounting board 121 may for example, comprise metal or be metal, or a printed circuit board having a ground plane. In other representative embodiments, the mounting board 121 may, for example, comprise a portion of a same lead frame as the leads 123. The second semiconductor die 122 may, for example, be made of a silicon material, and may include a plurality of semiconductor devices formed therein. In the example of FIG. 1, only one semiconductor die is illustrated, but aspects of the present disclosure are not limited thereto. In accordance with the present disclosure, one or more semiconductor die may be provided. A plurality of bond pads may be formed on each of the mounting board 121 and the second semiconductor die 122. Conductive wires 124 may connect the bond pads of the mounting board 121 and those of the second semiconductor die 122. As shown in the example of FIG. 1, the mounting board 121 and the second semiconductor die 122 are electrically connected to the one or more leads 123 by the conductive wires 124. Bond pads may also be formed on the leads 123 and may be connected to the conductive wires 124. Although FIG. 1 shows two conductive wires 124 bonded to the same lead, the two conductive wires may be connected to different leads. The conductive wires 124 may, for example, be made from one selected from the group consisting of gold (Au), copper (Cu), aluminum (Al), and suitable equivalents thereof, but aspects of the present disclosure are not limited thereto. In an alternative embodiment, the mounting board 121 may comprise bond pads for a flip-chip type attachment of the second semiconductor die 122.

In the example of FIG. 1, each of the leads 123 includes a first region 123a, a second region 123b, and a third region 123c. The first region 123a is positioned on the same plane with the mounting board 121. The bond pads may be formed in the first region 123a, and the conductive wires 124 may be connected from a bond pad of the first region 123a to respective bond pads of the mounting board 121 and semiconductor die 122, thereby electrically connecting the mounting board 121 and the second semiconductor die 122. In the example of FIG. 1, the second region 123b is electrically connected to the bond pad 114 on the circuit board 111 by the electrically conductive material 115 (e.g., a solder material), thereby forming an electrical connection to the circuit board 111. The third region 123c of the leads 123 electrically connects the first and second regions 123a, 123b and may be formed to be inclined.

In accordance with a representative embodiment of the present disclosure, the one or more leads 123 may be formed to surround the first and second semiconductor die 112, 122. In addition, the one or more leads 123 may include one or more leads serving as a ground, or other constant potential, and one or more signaling leads serving as transmission paths of other electrical signals. In a representative embodiment of the present disclosure, the signal leads and ground leads may alternate. It can be seen that, since a portion of the one or more leads 123 are grounded, it is possible to reduce or prevent electromagnetic interference (EMI) from penetrating into the semiconductor package. In other words, since the one or more leads 123 may be formed to surround a top portion of the circuit board 111 and the first and second semiconductor die 112, 122, and the one or more leads 123 may be grounded, externally generated undesirable electromagnetic signals (EMI) flow out through those leads of the one or more leads 123 that are held at ground, thereby reducing or preventing the EMI from penetrating into the semiconductor package 100 of FIG. 1.

In an embodiment in accordance with the example of FIG. 1, the adhesion member 130 bonds the first package 110 to the second package 120 between the first package 110 and the second package 120. Here, the first and second packages 110, 120 are bonded to each other such that the first semiconductor die 112 of the first package 110 and the second semiconductor die 122 of the second package 120 are positioned one over the other. That is to say, the adhesion member 130 may make direct contact with the first and second semiconductor die 112, 122 to bond the first and second packages 110, 120 to each other. In a representative embodiment of the present disclosure, there may not be a substrate or a lead frame between the first and second semiconductor die. In a representative embodiment of the present disclosure, a portion of the conductive wire 124 may pass through the adhesion member 130. That is to say, as illustrated in the example of FIG. 1, a portion of the conductive wire 124 may be surrounded by the adhesion member 130. Therefore, the portion of the conductive wire 124 and one surface of the second semiconductor die 122 may be sealed from an external environment by the adhesion member 130, and it is therefore possible to reduce or prevent external impacts from being applied thereto, while the conductive wire 124 and the second semiconductor die 122 may also be electrically insulated from devices provided in adjacent regions. In a representative embodiment of the present disclosure, an adhesion member such as the adhesion member 130 may, for example, include a film over wire (FOW) material, but aspects of the present disclosure are not limited thereto.

In accordance with the present disclosure, the encapsulant 140 may be formed to surround the first and second packages 110, 120. In the example of FIG. 1, the encapsulant 140 exposes surfaces opposite the surfaces of the first and second packages 110, 120 on which the first and second semiconductor die 112, 122 are mounted. In addition, the encapsulant 140 may expose a surface of the lead 123 positioned on the same plane with the mounting board 121. The encapsulant 140 protects the first and second semiconductor die 112, 122 and any other semiconductor devices provided within the semiconductor package 100 from external environmental factors. In addition, since the encapsulant 140 exposes one surface of the mounting board 121 of the second package 120, the heat generated from the inside of the semiconductor package 100 can be easily emitted. The encapsulant 140 may be made from, by way of example and not limitation, a silicone resin, an epoxy resin, or suitable equivalents thereof, but aspects of the present disclosure are not limited thereto.

As illustrated in the example of FIG. 1, the conductive members 150 are connected to the RDL 116 formed on the exposed surface of the circuit board 111. The conductive members 150 form a path through which the semiconductor package 100 may be electrically connected to an external circuit. The conductive members 150 may, for example, be in the shape of a ball, and may be made from, by way of example and not limitation, a solder material made of alloys of tin (Sn), lead (Pb), or silver (Ag), or suitable equivalents thereof, but aspects of the present disclosure are not limited thereto.

As described above, the semiconductor package 100 according to an embodiment of the present disclosure may be configured such that one or more of the leads 123 surrounding the first and second semiconductor die 112, 122 are grounded, thereby reducing or preventing undesirable EMI that is externally applied from penetrating into the semiconductor package 100.

In addition, since one surface of the second semiconductor die 122 and a portion of the conductive wire 124 are sealed by the adhesion member 130, they can be protected from external impacts and can be electrically insulated from devices in adjacent regions.

Further, since the first and second packages 110, 120 may be encapsulated by the encapsulant 140 at the same time during packaging, warpage of various elements of the first and second packages 110, 120 due to differences in the coefficients of thermal expansion of the elements of the first and second packages 110, 120 can be reduced or prevented.

Hereinafter, a configuration of a semiconductor package according to another embodiment of the present disclosure will be described.

Figure 2:
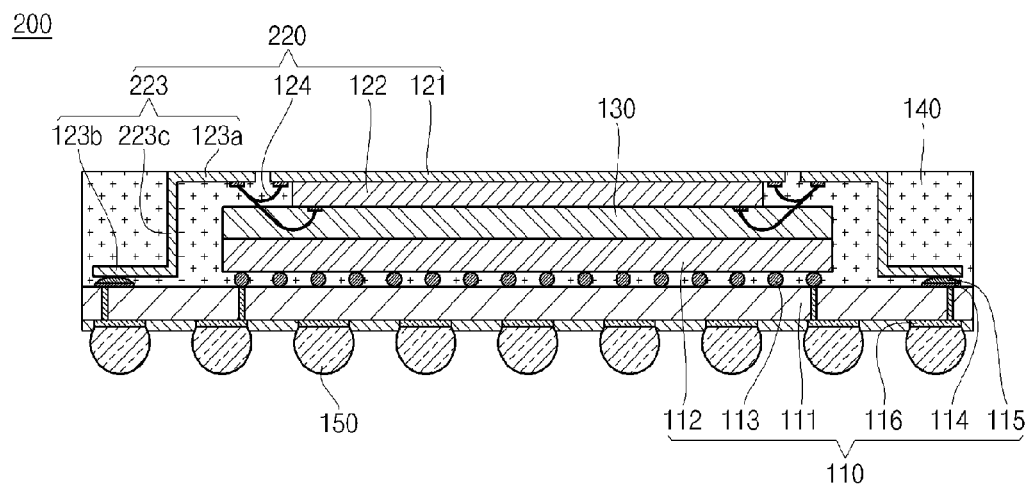
FIG. 2 is a cross-sectional view of a semiconductor package according to another embodiment of the present disclosure.

FIG. 2 is a cross-sectional view of a semiconductor package 200 according to another embodiment of the present disclosure. The same functional components and operations as those of the previous embodiment are denoted by the same reference numerals and the following description will focus on differences between the present and previous embodiments.

Referring now to the example of FIG. 2, the semiconductor package 200 according to another embodiment of the present disclosure includes a first package 110 comprising a circuit board 111 and a first semiconductor die 112 mounted on the circuit board 111, and a second package 220 comprising a mounting board 121, one or more second semiconductor die 122 mounted on the mounting board 121, and one or more leads 223 electrically connected to the mounting board 121 and to the second semiconductor die 122. The semiconductor package 200 also includes an adhesion member 130 bonding the first package 110 to the second package 220. In addition, the first and second packages 110, 220 are encapsulated by an encapsulant 140 that exposes to the outside of the semiconductor package 200, the surfaces of the first and second packages 110, 220 opposite the surfaces on which the first and second semiconductor dies 112, 122 are mounted. In addition, as shown in the example of FIG. 2, a plurality of conductive members 150 may be formed on the circuit board 111. Such conductive members 150 may be made of, by way of example and not limitation, a solder material as described herein.

While the third region 123c of each of the leads 123 of the second package 120 in the example of FIG. 1 is illustrated as being inclined, the third region 223c of the leads 223 of the second package 220 in the example semiconductor package 200 of FIG. 2 is shown as being perpendicular to the first and second regions 123a, 123b. In other words, the third region 223c, which connects the first region 123a, electrically connected to the mounting board 121 and the second semiconductor die 122, to the second region 123b, electrically connected to the circuit board 111, may be fabricated to be perpendicular to the first and second regions 123a, 123b of the leads 223. Therefore, the semiconductor package 200 can be formed to have a relatively smaller width than the semiconductor package 100 of FIG. 1, thereby achieving further miniaturization of the semiconductor package 200.

As described above with respect to the example of FIG. 1, in the semiconductor package 200 according to another embodiment of the present disclosure, one or more of the leads 223 surrounding the first and second semiconductor die 112, 122 may be grounded, thereby reducing or preventing undesirable EMI that is externally applied from penetrating into the semiconductor package 200.

In addition, since a portion of the conductive wires 124 and one surface of the second semiconductor die 122 are sealed by the adhesion member 130, those sealed components are protected from external impacts and are electrically insulated from devices in adjacent regions.

Further, since the first and second packages 110, 120 are encapsulated by the encapsulant 140 at the same time, warpage due to differences in the coefficients of thermal expansion of the first and second packages 110, 120 can be reduced or prevented.

Hereinafter, a configuration of a semiconductor package according to still another embodiment of the present disclosure will be described.

Figure 3:
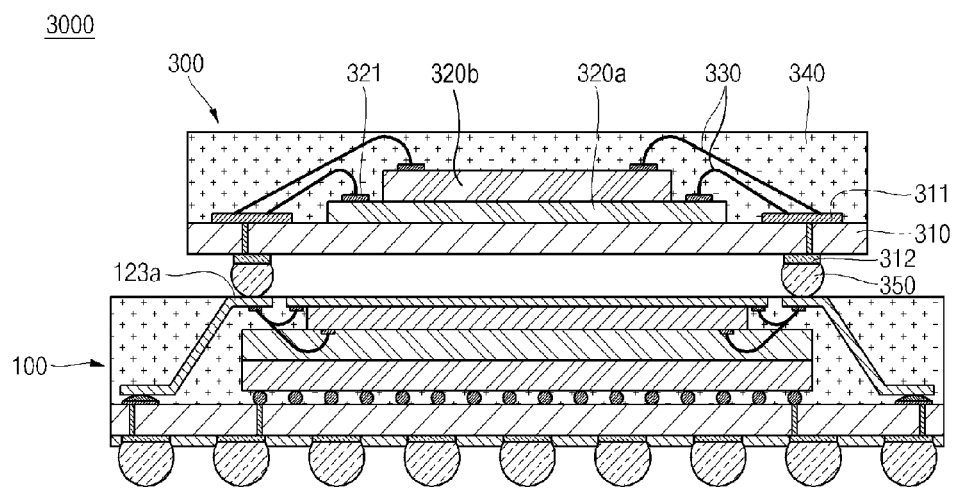
FIG. 3 is a cross-sectional view of a semiconductor package according to still another embodiment of the present disclosure.

FIG. 3 is a cross-sectional view of a semiconductor package 3000 according to still another embodiment of the present disclosure. The same functional components and operations as those of the previous embodiment are denoted by the same reference numerals and the following description will focus on differences between the present and previous embodiments.

Referring to FIG. 3, the semiconductor package 3000 according to still another embodiment of the present disclosure includes the semiconductor package 100 (to be defined as a first semiconductor package) and a second semiconductor package 300. The semiconductor package 10 shown in FIG. 3 may correspond to, for example, the semiconductor package 100 of FIG. 1, described above.

As illustrated in the example of FIG. 3, the second semiconductor package 300 includes a circuit board 310, two semiconductor die 320a, 320b mounted on the circuit board 310, and a plurality of conductive wires 330 electrically connecting the circuit board 310 and the semiconductor die 320a, 320b. An encapsulant 340 encapsulates the circuit board 310, the two semiconductor die 320a, 320b, and the conductive wires 330. One or more conductive members 350 connected to the circuit board 310 electrically interconnect the circuit board 310 to the first semiconductor package 100. The conductive members 350 may comprise, for example, a solder material, and may be in the shape of a ball.

As shown in the example of FIG. 3, a plurality of bond pads 311 are formed on a top surface of the circuit board 310 and a redistribution layer (RDL) 312, which may be electrically connected to the bond pads 311, is exposed to a bottom surface of the circuit board 310. The semiconductor die 320a, 320b may, for example, be made of a silicon material and may include a plurality of semiconductor devices formed therein. In addition, a plurality of bond pads 321 may be formed on the semiconductor die 320a, 320b, and may correspond to the bond pads 311 on the circuit board 310. The semiconductor die 320a, 320b of the present disclosure may, for example, be mounted on the circuit board 310 by an adhesive layer (not shown). In addition, the semiconductor die 320a, 320b may be bonded to each other by, for example, an adhesive layer (not shown).

In the illustrated embodiment of FIG. 3, two semiconductor die 320a, 320b mounted together on the circuit board 310 are exemplified, but aspects of the present disclosure are not limited thereto. It should be understood that one, two, or more than two semiconductor die may be mounted on the circuit board 310 in the manner shown, without departing from the scope of the present disclosure. The conductive wires 330 electrically connect the bond pads 311, 321 respectively formed on the circuit board 310 and the semiconductor die 320a, 320b. Therefore, the circuit board 310 and the semiconductor die 320a, 320b are electrically connected by the conductive wires 330. The conductive wires 330 may be made from, by way of example and not limitation, one selected from the group consisting of gold (Au), copper (Cu), aluminum (Al), and suitable equivalents thereof, but aspects of the present disclosure are not limited thereto. The encapsulant 340 may be formed to entirely cover the semiconductor die 320a, 320b mounted on the circuit board 310 and the conductive wires 330. The encapsulant 340 protects semiconductor devices provided within the semiconductor package, including the semiconductor die 320a, 320b and the conductive wires 330, from external environmental factors. The encapsulant 340 may be made from, by way of example and not limitation, a silicone resin, an epoxy resin, or suitable equivalents thereof, but aspects of the present disclosure are not limited thereto. As illustrated in the example of FIG. 3, the conductive members 350 are connected to the RDL 312 of the circuit board 310. In addition, the conductive members 350 may be connected to a first region 123a of the leads 123 exposed by the encapsulant in the first semiconductor package 100. That is to say, the first and second semiconductor packages 100, 300 are electrically connected to each other by the conductive members 350 of the second semiconductor package 300. The conductive members 350 may be made from, by way of example and not limitation, alloys of tin (Sn), lead (Pb), or silver (Ag), or suitable equivalents thereof, but aspects of the present disclosure are not limited thereto.

Hereinafter, a configuration of a semiconductor package according to still another embodiment of the present disclosure will be described.

Figure 4:
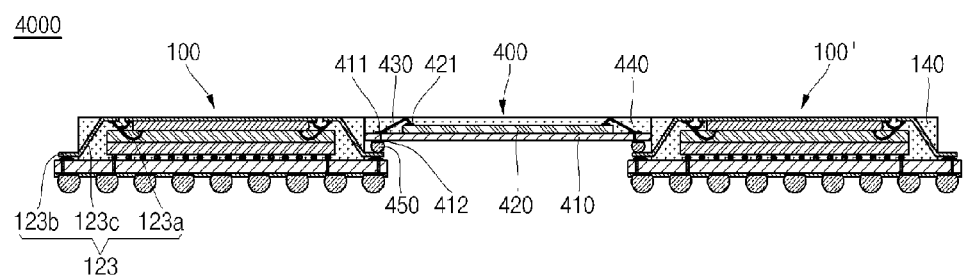
FIG. 4 is a cross-sectional view of a semiconductor package according to still another embodiment of the present disclosure.

FIG. 4 is a cross-sectional view of a semiconductor package according to still another embodiment of the present disclosure. The same functional components and operations as those of the previous embodiment are denoted by the same reference numerals and the following description will focus on differences between the present and previous embodiments.

Referring now to the example of FIG. 4, the semiconductor package 4000 according to still another embodiment of the present disclosure includes a semiconductor package 100 (to be defined as a first semiconductor package) that may correspond to, for example, the semiconductor package 100 of FIG. 1 or a variant thereof, a second semiconductor package 100' that may be the same as the first semiconductor package 100, and is spaced apart therefrom (and to be defined as a second semiconductor package), and a third semiconductor package 400 that may electrically connect to the first and second semiconductor packages 100, 100'.

As illustrated in the example of FIG. 4, the first and second semiconductor packages 100, 100' are positioned in spaced relation from each other. In addition, the first and second semiconductor packages 100, 100' are formed to expose a region of a lead, such as the second region 123b of the leads 123 of the example semiconductor package of FIG. 1. In other words, the first and second semiconductor packages 100, 100' may be formed such that the encapsulant 140 exposes the second region 123b while encapsulating other regions of the leads, such as the first and third regions 123a, 123c of the leads 123 of the example embodiment of FIG. 1. In a similar manner in accordance with the present disclosure, the encapsulation of the example of FIG. 2 may be similarly performed, to expose a surface of the second region 123b of one or more of the leads 223c.

In the example of FIG. 4, the third semiconductor package 400 includes a circuit board 410, one or more semiconductor die 420 mounted on the circuit board 410, a plurality of conductive wires 430 electrically connecting the circuit board 410 and the semiconductor die 420, and an encapsulant 440 encapsulating the circuit board 410, the semiconductor die 420 and the conductive wires 430. A plurality of conductive members 450 may be formed on circuit board the 410 and may electrically connect the circuit board 410 to the first and second semiconductor packages 100, 100'. The conductive members 450 may, for example, be in the shape of a ball, and may comprise, by way of example and not limitation, a solder, as described herein. As shown in the example of FIG. 4, the third semiconductor package 400 may be positioned between the first and second semiconductor packages 100, 100', and may, for example, electrically connect the first and second semiconductor packages 100, 100'

As shown in the example illustrated in FIG. 4, a plurality of bond pads 411 may be formed on a top surface of the circuit board 410 and a redistribution layer (RDL) 412 electrically connected to the bond pads 411 may be exposed to a bottom surface of the circuit board 410. The semiconductor die 420 may, for example, be made of a silicon material and may include a plurality of semiconductor devices formed therein. In addition, a plurality of bond pads 421 may be formed on the semiconductor die 420, and may correspond to the bond pads 411 of the circuit board 410. The semiconductor die 420 may be mounted on the circuit board 410 by, for example, an adhesive layer (not shown). In the illustrated embodiment of FIG. 4, only one semiconductor die 420 mounted on the circuit board 410 is exemplified, but aspects of the present disclosure are not limited thereto. It should be recognized that more than one semiconductor die may also be mounted on the circuit board 410, without departing from the scope the present disclosure. The conductive wires 430 electrically connect the plurality of bond pads 411, 421 respectively formed on the circuit board 410 and the semiconductor die 420. Therefore, the circuit board 410 and the semiconductor die 420 are electrically connected by the conductive wires 430. The conductive wires 430 may be made from, by way of example and not limitation, one selected from the group consisting of gold (Au), copper (Cu), aluminum (Al), and suitable equivalents thereof, but aspects of the present disclosure are not limited thereto.

The encapsulant 440 may be formed to entirely cover the semiconductor die 420 mounted on the circuit board 410 and the conductive wires 430. In this manner, the encapsulant 440 protects semiconductor devices provided within the semiconductor package 400, including the semiconductor die 420 and the conductive wires 430, from external environmental factors. The encapsulant 440 may be made from, by way of example and not limitation, a silicone resin, an epoxy resin, or suitable equivalents thereof, but aspects of the present disclosure are not limited thereto. The conductive members 450 may be connected to the RDL 412 of the circuit board 410. In addition, as discussed above, the conductive members 450 may be connected to a second region 123b of the leads 123 that may be exposed by the encapsulant in the first and second semiconductor packages 100, 100'. In other words, the conductive members 450 of the third semiconductor package 400 may be electrically connected to the exposed second region 123b of the leads 123 at one side of the first semiconductor package 100, and may be electrically connected to the exposed region 123b at one side of the second semiconductor package 100', when positioned between the first and second semiconductor packages 100, 100'. That is to say, the first, second, and third semiconductor packages 100, 100',d 400 may be electrically interconnected through the third semiconductor package 400. The conductive members 450 may be, for example, in the shape of a ball, and may be made from, by way of example and not limitation, alloys of tin (Sn), lead (Pb), or silver (Ag), or suitable equivalents thereof, but aspects of the present disclosure are not limited thereto.

Hereinafter, a method of fabricating a semiconductor package according to an embodiment of the present disclosure will be described.

Figure 5:
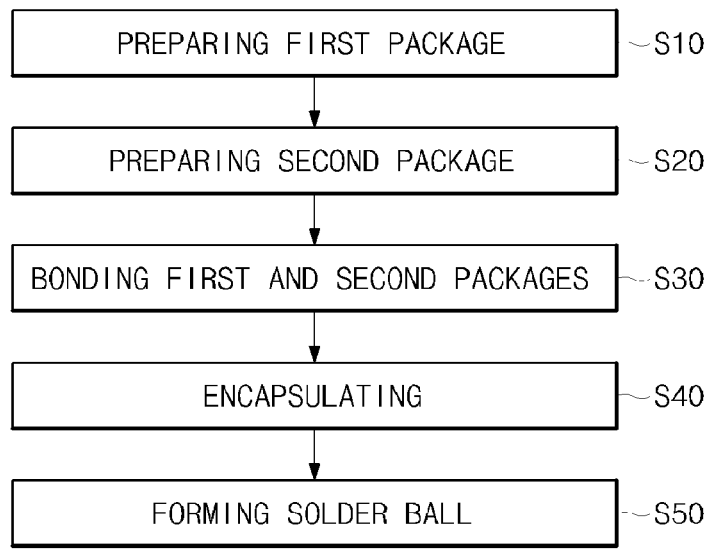
FIG. 5 is a flowchart illustrating an exemplary method of fabricating a semiconductor package, according to an embodiment of the present disclosure.

FIG. 5 is a flowchart illustrating an exemplary method of fabricating a semiconductor package, according to an embodiment of the present disclosure.

Referring now to the example of FIG. 5, the method of fabricating a semiconductor package according to an embodiment of the present disclosure includes preparing a first package (S10), preparing a second package (S20), bonding the first and second packages to each other (S30), encapsulating the bonded first and second packages (S40), and forming a plurality of conductive members (S50).

FIG. 6A to FIG. 6E are cross-sectional views sequentially illustrating process steps of the example method of fabricating a semiconductor package shown in FIG. 5, in accordance with the present disclosure. Hereinafter, the method of fabricating a semiconductor package according to an embodiment of the present disclosure will be described with reference to FIGS. 6A to 6E together with FIG. 5.

Figure 6A:
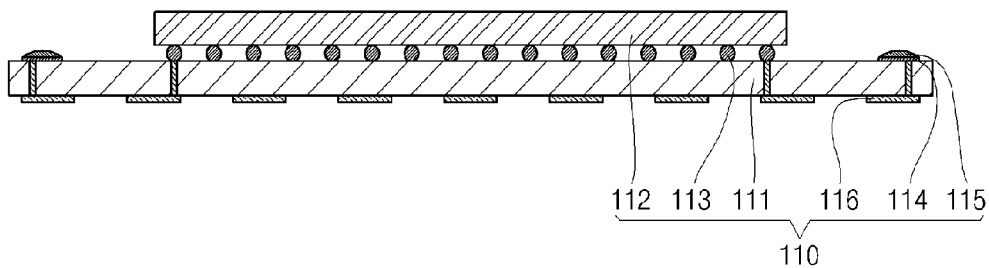
FIG. 6A to FIG. 6E are cross-sectional views sequentially illustrating process steps of the example method of fabricating a semiconductor package shown in FIG. 5, in accordance with the present disclosure.

Referring to FIG. 5 and FIG. 6A, a first package may be prepared, where the first package comprises a circuit board 111 having a first semiconductor die 112 mounted thereon (S10). The first package 110 may be formed by electrically connecting the first semiconductor die 112 and the circuit board 111, in a manner such as that described herein.

In a representative embodiment of the present disclosure, a plurality of conductive patterns may be formed on a first or top surface of the circuit board 111. In addition, the circuit board 111 may include a plurality of bond pads 114, for later connection to a corresponding plurality of leads, and a conductive material 115, which may comprise a solder material be pre-coated on the bond pads 114. Further, a redistribution layer (RDL) 116 that is electrically connected to the plurality of conductive patterns formed on the first or top surface of the circuit board 111, may be exposed to a second or bottom surface of the circuit board 111. A plurality of conductive members, described below, may later be formed at selected locations on the RDL 116, as described below.

In the example of FIG. 6A, the first semiconductor die 112 may be made of, by way of example and not limitation, a silicon or other suitable material, and may include a plurality of semiconductor devices formed therein. A plurality of conductive patterns may be formed on a first surface of the first semiconductor die 112, and may be electrically connected to conductive bumps 113 formed on a second surface of the first semiconductor die 112 by an RDL provided within the first semiconductor die 112. As illustrated, the first semiconductor die 112 is electrically connected to the conductive patterns of the circuit board 111 by the conductive bumps 113. The conductive bumps 113 may be formed of, for example, a solder material as described herein.

Figure 6B:
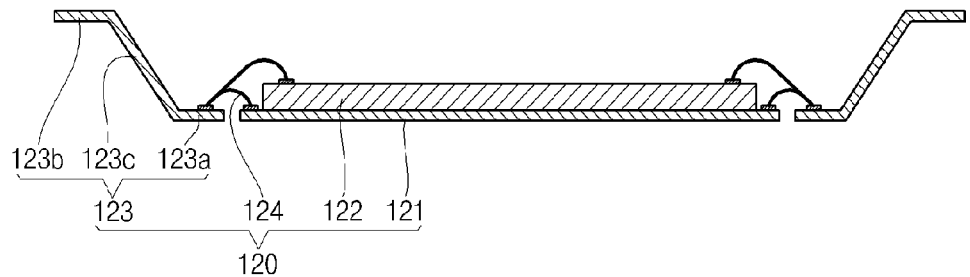

Referring now to FIG. 5 and FIG. 6B, a second package may be prepared, where the second package includes a mounting board 121 having one or more second semiconductor die 122 mounted thereon, and a plurality of leads 123 electrically connected to the mounting board 121 and to the second semiconductor die 122 (S20). The second package 120 may be formed by mounting the second semiconductor die 122 on the mounting board 121, and electrically connecting the mounting board 121 and the second semiconductor die 122 to leads 123 through conductive wires 124.

In a representative embodiment of the present disclosure, a plurality of bond pads may be formed on a surface of the mounting board 121. A second semiconductor die 122 may be mounted on the mounting board 121 by, for example, an adhesive layer (not shown). The second semiconductor die 122 may be made of, by way of example and not limitation, silicon or any other suitable material, and may include a plurality of semiconductor devices formed therein. In addition, a plurality of bond pads may be formed on a surface of the second semiconductor die 122. In the illustrated embodiment of FIG. 6B, only one semiconductor die 122 mounted on the mounting board 121 is exemplified, but aspects of the present disclosure are not limited thereto. It should be noted that more than one semiconductor die may be mounted on the mounting board 121 without departing from the scope of the present disclosure.

The leads 123 may be positioned to surround the mounting board 121 and the second semiconductor die 122. The leads 123 may be positioned on the same plane with a surface of the mounting board 121. In addition, one or more bond pads may be formed on the leads 12, and the plurality of leads 123 may include one or more leads that may serve as a ground, and one or more signal leads that may serve as a transmission path of electrical signals.

The conductive wires 124 may be formed to connect the bond pads of the mounting board 121 and the second semiconductor die 122 to the bond pads of the leads 123. That is to say, the mounting board 121 and the second semiconductor die 122 may be electrically connected to the leads 123 by the conductive wires 124. The conductive wires 124 may be made from, by way of example and not limitation, one selected from the group consisting of gold (Au), copper (Cu), aluminum (Al), and suitable equivalents thereof, but aspects of the present disclosure are not limited thereto.

Figure 6C:
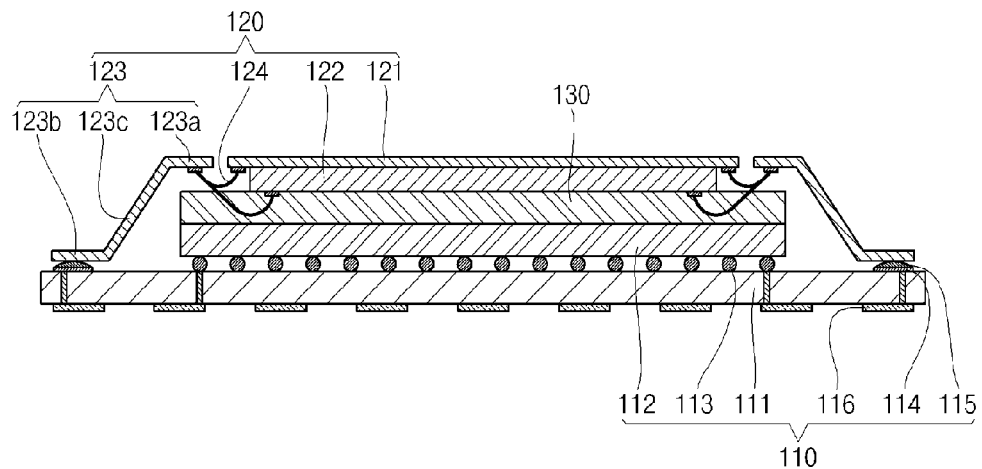

Referring now to FIG. 5 and FIG. 6C, in a representative embodiment in accordance with the present disclosure, the first and second packages 110, 120 may be bonded to each other by an adhesion member 130 (S30). Here, the first and second packages 110, 120 are bonded to each other such that the first semiconductor die 112 and the second semiconductor die 122 are stacked so that they are positioned one over the other. In a representative embodiment of the present disclosure, there may not be a substrate or lead frame between the first and second semiconductor die. That is to say, the first and second semiconductor die 112, 122 are stacked one over the other with the adhesion member 130 disposed therebetween, thereby bonding the first and second packages 110, 120 to each other. The adhesion member 130 may comprise, for example, a film over wire (FOW) material. Therefore, as the result of the stacking, the conductive wires 124 may pass through the adhesion member 130 and penetrate into the adhesion member 130. In a representative embodiment of the present disclosure, the stacked structure of the first package 110, the adhesion member 130, and the second package 120 may, for example, be cured at a temperature of approximately 150° C., thereby completing the bonding of the first and second packages 110, 120 using the adhesion member 130.

Figure 6D:
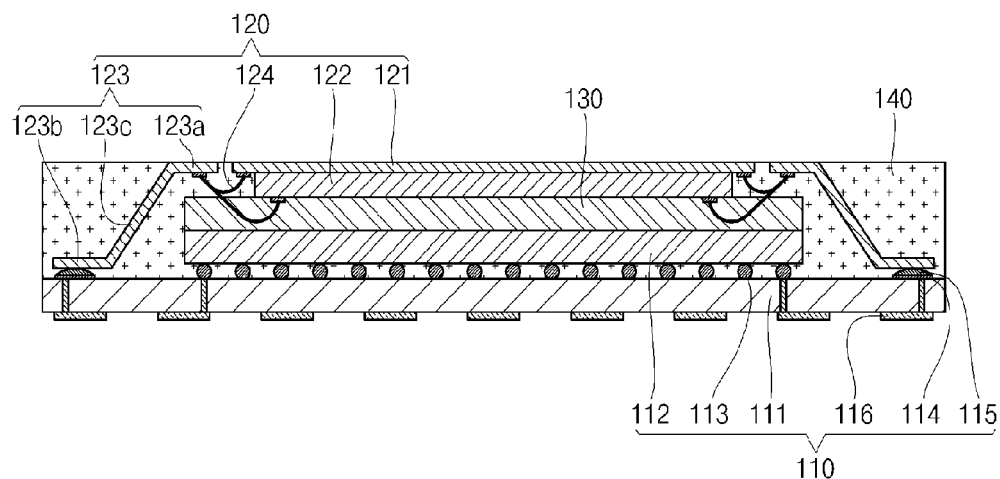

Referring now to FIG. 5 and FIG. 6D, the first and second packages 110, 120 may encapsulated by an encapsulant 140 (S40). In the example of FIG. 6D, the encapsulant 140 is formed to entirely surround side portions of the second package 120 from a top portion of the first package 110. That is to say, in accordance with the present disclosure, the encapsulant 140 may be formed to expose to the outside environment, surfaces of the first and second packages 110, 120 opposite those on which the first and second semiconductor dies 112, 122 are mounted. In a representative embodiment of the present disclosure, the encapsulant 140 may also expose a surface of the leads 123 positioned on the same plane with the exposed mounting board 121 to the outside (e.g., first regions 123*a*). The encapsulant 140 may be made from one selected from the group consisting of, by way of example and not limitation, a silicone resin, an epoxy resin, or suitable equivalents thereof, but aspects of the present disclosure are not limited thereto.

Figure 6E:
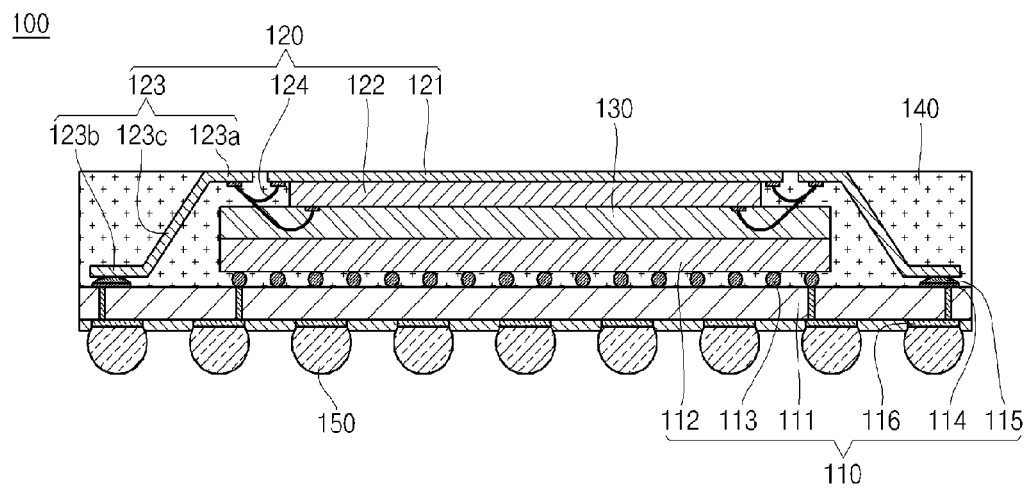

Referring now to FIG. 5 and FIG. 6E, a plurality of conductive members 150 may be formed on the first package 110 (S50). The conductive members 150 may be connected to the RDL 116 on the surface of the circuit board 111 that is exposed by the encapsulant 140. The conductive members 150 form a path through which the semiconductor package may be electrically connected to an external circuit. The conductive members 150 may be made from alloys of tin (Sn), lead (Pb), or silver (Ag), or suitable equivalents thereof, but aspects of the present disclosure are not limited thereto.

As described above, in the method of fabricating the semiconductor package according to an embodiment of the present disclosure, at least one of the leads 123 surrounding the first and second semiconductor die 112, 122 may be grounded, thereby reducing or preventing undesirable EMI that is externally applied, from penetrating into the semiconductor package 100.

In addition, since one surface of the second semiconductor die 122 and a portion of the conductive wires 124 are sealed by the adhesion member 130, they are protected from external impacts and are electrically insulated from devices in adjacent regions.

Further, because the first and second packages 110, 120 are encapsulated by the encapsulant 140 at the same time during manufacture of the semiconductor device 100, warpage of semiconductor die and other elements, due to differences in the coefficients of thermal expansion of the elements of the first and second packages 110, 120, may be reduced or prevented.

The present disclosure addresses the shortcomings of the prior art identified herein by providing a semiconductor package that reduces or prevents undesirable electromagnetic interference (EMI) externally applied, from penetrating into the semiconductor package, by allowing at least one of a plurality of leads configured to surround the semiconductor package to be grounded. A method of fabricating such a semiconductor package is described.

In accordance with the present disclosure, there is provided a semiconductor package comprising a first package including a circuit board and a first semiconductor die mounded on the circuit board; a second package including a mounting board and at least one second semiconductor die mounted on the mounting board, and one or more leads electrically connected to the mounting board and the second semiconductor die. Such a semiconductor package may also comprise an adhesion member bonding the first package to the second package, wherein the one or more leads are electrically connected to the circuit board and at least one among the leads is grounded.

In a representative embodiment of the present disclosure, the first package and the second package may be stacked such that the first and second semiconductor die are positioned one over the other, and one or more leads may be formed to surround the first and second semiconductor die. In a representative embodiment of the present disclosure, there may not be a substrate or lead frame between the first and second semiconductor die. The circuit board and the first semiconductor die may be electrically connected by conductive bumps that may be made of a solder material. The mounting board and the second semiconductor die may be electrically connected by the one or more leads and wires. A portion of each of the wires may be surrounded by the adhesion member.

The first and second packages may be encapsulated by an encapsulant, and surfaces opposite to surfaces of the circuit board and the mounting board on which the first and second semiconductor dies are respectively mounted, may be exposed by the encapsulant. The circuit board may further include conductive members formed thereon, which may be made of a solder material.

Each of the one or more leads may have a first region electrically connected to the mounting board and the second semiconductor die, a second region electrically connected to the circuit board, and a third region connecting the first and second regions to each other. The third region may be formed to be inclined, or the third region may be perpendicular to the first and second regions. The adhesion member may include a film over wire (FOW) material.

In accordance with the present disclosure, a first semiconductor package may be spaced apart from a second semiconductor package, which may be another of the first semiconductor package, and the first and second semiconductor packages may be electrically connected to each other by a third semiconductor package.

In accordance with the present disclosure, there is provided a method of fabricating a semiconductor package, where the method includes preparing a first package including a circuit board having a first semiconductor die mounted thereon; preparing a second package including a mounting board having a second semiconductor die mounted thereon and one or more leads electrically connected to the mounting board and the second semiconductor die; bonding the first package and the second package to each other using an adhesion member; encapsulating the first package and the second package using an encapsulant; and forming conductive members on the first package.

The first package and the second package may be stacked such that the first semiconductor die and the second semiconductor die are positioned one over the other. In a representative embodiment of the present disclosure, there may not be a substrate or lead frame between the first and second semiconductor die. The one or more leads may be formed to surround the first semiconductor die and second semiconductor die. The circuit board and the first semiconductor die may be electrically connected by conductive bumps. The mounting board and the second semiconductor die may be connected by the one or more leads and conductive wires.

The encapsulant may expose surfaces of the circuit board and the mounting board opposite the surfaces on which the first and second semiconductor die are mounted. The adhesion member may include a film over wire (FOW) material.

As described above, in the semiconductor package and the method of fabricating the same, electromagnetic waves undesirably induced from outside of the semiconductor package can be reduced or prevented from penetrating into the semiconductor package by arranging at least one of a plurality of leads configured to surround the semiconductor package, to be grounded.

Aspects of the disclosure may be seen in a semiconductor package comprising a first package comprising a circuit board and a first semiconductor die mounted on the circuit board; and a second package comprising a mounting board, at least one second semiconductor die mounted on the mounting board, and a plurality of leads electrically connected to the mounting board and/or the second semiconductor die. The semiconductor package may also comprise an adhesion member bonding the first package to the second package, and an encapsulant encapsulating the first package and the second package. The circuit board, the mounting board, and the plurality of leads may be arranged to surround the first semiconductor die and the second semiconductor die, and the plurality of leads may be electrically connected to the circuit board. The first package and the second package may be stacked such that the first and second semiconductor die are positioned one over the other with the adhesion member positioned between the first and second semiconductor die, and at least one among the plurality of leads may be grounded. In a representative embodiment of the present disclosure, there may not be a substrate or lead frame between the first and second semiconductor die. The mounting board and/or the second semiconductor die may be electrically connected to the one or more leads by conductive wires, and the circuit board and the first semiconductor die may be electrically connected to each other by conductive bumps.

In a representative embodiment of the present disclosure, a portion of each of the conductive wires that is attached to the second semiconductor die may be surrounded by the adhesion member. Surfaces of the circuit board and the mounting board opposite those on which the first and second semiconductor die may be mounted may be exposed by the encapsulant. The circuit board may further comprise conductive members formed on the surface of the circuit board that is exposed by the encapsulant. Each of the plurality of leads may have a first region comprising a first electrical connection to the mounting board and/or the second semiconductor die, a second region comprising a second electrical connection to the circuit board, and a third region connecting the first and second regions to each other. The third region may be perpendicular to the first and second regions. Surfaces of the circuit board and the mounting board opposite those on which the first and second semiconductor die are mounted may be exposed by the encapsulant, and the encapsulant may expose the first region of the plurality of leads to the exterior of the semiconductor package. An exposed portion of the first region may be on an opposite side of a non-exposed portion of the first region that comprises the first electrical connection.

Additional aspects of the present disclosure may be found in a method of fabricating a semiconductor package. Such a method may comprise preparing a first package comprising a circuit board and a first semiconductor die mounted on the circuit board; and preparing a second package comprising a mounting board, a second semiconductor die mounted on the mounting board, and a plurality of leads electrically connected to the mounting board and/or the second semiconductor die. The method may also comprise bonding the first package and the second package to each other using an adhesion member, encapsulating the bonded first package and the second package using an encapsulant; and forming conductive members on the first package. The first package and the second package may be stacked such that the first semiconductor die and the second semiconductor die are positioned one over the other with the adhesion member positioned between the first and second semiconductor die, and the plurality of leads may be formed to surround the first semiconductor die and the second semiconductor die. In a representative embodiment of the present disclosure, there may not be a substrate or lead frame between the first and second semiconductor die. The mounting board and/or the second semiconductor die may be electrically connected to the plurality of leads by conductive wires, where the circuit board and the first semiconductor die may be electrically connected to each other by conductive bumps. The encapsulant may expose surfaces of the circuit board and the mounting board, opposite the surfaces on which the first semiconductor die and the second semiconductor die are mounted. The adhesion member may comprise a film over wire (FOW) material.

Further aspect of the present disclosure may be observed in a system. Such a system may comprise a first semiconductor package and a second package. The first package may comprise a first semiconductor die mounted on a first circuit board. The second package may comprise a second semiconductor die mounted on a mounting board, and a plurality of leads electrically connected to the second semiconductor die and to the first circuit board. The system may also comprise an adhesion member bonding the first package to the second package, and an encapsulant that encapsulates the first package and the second package. Each of the plurality of leads may have a first region comprising a first electrical connection to the mounting board and/or the second semiconductor die, a second region comprising a second electrical connection to the first circuit board, and a third region connecting the first and second regions to each other. Surfaces of the first circuit board and the mounting board opposite those on which the first semiconductor die and the second semiconductor die are mounted may be exposed by the encapsulant, and the encapsulant may expose a respective portion of the first region on an opposite side of a non-exposed portion of the first region of each of the plurality of leads to the exterior of the first semiconductor package. The system may also comprise a second semiconductor package. The second semiconductor package may comprise one or more semiconductor die mounted to a second circuit board. The second circuit board may comprise a plurality of conductive members electrically connected to the second circuit board and to the respective portion of the first region of each of the plurality of leads exposed to the exterior of the first semiconductor package by the encapsulant. The plurality of leads may be formed to surround the first semiconductor die and second semiconductor die, the mounting board and/or the second semiconductor die may be connected to the plurality of leads by conductive wires, and the circuit board and the first semiconductor die may be electrically connected to each other by conductive bumps.

The present application provides a number of exemplary embodiments of the inventive concepts contained herein. The scope of the present disclosure is not limited by these exemplary embodiments. Numerous variations, whether explicitly provided for by the specification or implied by the specification, such as variations in structure, dimension, type of material and manufacturing process, may be implemented by one skilled in the art in view of this disclosure.

While the description of the present disclosure has been made with respect to the exemplary embodiments, various changes and modifications may be made without departing from the scope of the disclosure. Therefore, the scope of the present disclosure should be defined by the appended claims rather than by the example embodiments shown herein.

While the present disclosure has been described with reference to certain embodiments, it will be understood by those skilled in the art that various changes may be made and suitable equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiment disclosed, but that the present disclosure will include all embodiments falling within the scope of the appended claims.

What is claimed is:

1. A semiconductor package comprising:
a first package comprising a circuit board and a first semiconductor die mounted on the circuit board;
a second package comprising a mounting board, at least one second semiconductor die mounted on the mounting board, and a plurality of leads electrically connected to the mounting board and/or the second semiconductor die;
an adhesion member bonding the first package to the second package; and
an encapsulant encapsulating the first package and the second package,
wherein the circuit board, the mounting board, and the plurality of leads are arranged to surround the first semiconductor die and the second semiconductor die, and the plurality of leads are electrically connected to the circuit board.

2. The semiconductor package according to claim 1, wherein the first package and the second package are stacked such that the first and second semiconductor die are positioned one over the other with the adhesion member positioned between the first and second semiconductor die, and wherein at least one among the plurality of leads is grounded.

3. The semiconductor package according to claim 1, wherein the mounting board and/or the second semiconductor die are electrically connected to the plurality of leads by conductive wires.

4. The semiconductor package according to claim 3, wherein the circuit board and the first semiconductor die are electrically connected to each other by conductive bumps.

5. The semiconductor package according to claim 4, wherein a portion of each of the conductive wires that is attached to the second semiconductor die is surrounded by the adhesion member.

6. The semiconductor package according to claim 1, wherein surfaces of the circuit board and the mounting board opposite those on which the first and second semiconductor die are mounted are exposed by the encapsulant, and wherein the circuit board further comprises conductive members formed on the surface of the circuit board that is exposed by the encapsulant.

7. The semiconductor package according to claim 1, wherein each of the plurality of leads has a first region comprising a first electrical connection to the mounting board and/or the second semiconductor die, a second region comprising a second electrical connection to the circuit board, and a third region connecting the first and second regions to each other.

8. The semiconductor package according to claim 7, wherein the third region is perpendicular to the first and second regions.

9. The semiconductor package according to claim 7, wherein surfaces of the circuit board and the mounting board opposite those on which the first and second semiconductor die are mounted are exposed by the encapsulant, and wherein the encapsulant exposes the first region of each of the plurality of leads to the exterior of the semiconductor package.

10. The semiconductor package according to claim 9, wherein an exposed portion of the first region is on an opposite side of a non-exposed portion of the first region that comprises the first electrical connection.

11. A system comprising:
a first semiconductor package comprising:
a first package comprising a first semiconductor die mounted on a first circuit board;
a second package comprising a second semiconductor die mounted on a mounting board, and a plurality of leads electrically connected to the second semiconductor die and to the first circuit board;
an adhesion member bonding the first package to the second package;
an encapsulant that encapsulates the first package and the second package, wherein each of the plurality of leads has a first region comprising a first electrical connection to the mounting board and/or the second semiconductor die, a second region comprising a second electrical connection to the first circuit board, and a third region connecting the first and second regions to each other, wherein surfaces of the first circuit board and the mounting board opposite those on which the first semiconductor die and the second semiconductor die are mounted are exposed by the encapsulant, and wherein the encapsulant exposes a respective portion of the first region on an opposite side of a non-exposed portion of the first region of each of the plurality of leads to the exterior of the first semiconductor package; and a second semiconductor package comprising:
one or more semiconductor die mounted to a second circuit board, the second circuit board comprising a plurality of conductive members electrically connected to the second circuit board and to the respective portion of the first region of each of the plurality of leads exposed to the exterior of the first semiconductor package by the encapsulant.

12. The system according to claim 11, wherein the plurality of leads are formed to surround the first semiconductor die and second semiconductor die.

13. The system according to claim 11, wherein the mounting board and/or the second semiconductor die are connected to the plurality of leads by conductive wires.

14. The system according to claim 11, wherein the circuit board and the first semiconductor die are electrically connected to each other by conductive bumps.

15. A system comprising:
a first semiconductor package comprising:
a first package comprising a first semiconductor die mounted on a first circuit board;
a second package comprising a second semiconductor die mounted on a mounting board, and a plurality of leads electrically connected to the second semiconductor die and to the first circuit board;
an adhesion member bonding the first package to the second package;
an encapsulant that encapsulates the first package and the second package, wherein each of the plurality of leads has a first region comprising a first electrical connection to the mounting board and/or the second semiconductor die, a second region comprising a second electrical connection to the first circuit board, and a third region connecting the first and second regions to each other, wherein surfaces of the first circuit board and the mounting board opposite those on which the first semiconductor die and the second semiconductor die are mounted are exposed by the encapsulant, and wherein the encapsulant exposes to the exterior of the first semiconductor package, a respective portion of a side of the second region of each of the plurality of leads opposite the second electrical connection to the first circuit board; and a second semiconductor package comprising:
one or more semiconductor die mounted to a second circuit board, the second circuit board comprising a plurality of conductive members electrically connected to the second circuit board and to the respective portion of the second region of each of the plurality of leads exposed to the exterior of the first semiconductor package by the encapsulant.

16. The system according to claim 15, wherein the plurality of leads are formed to surround the first semiconductor die and second semiconductor die.

17. The system according to claim 15, wherein the mounting board and/or the second semiconductor die are connected to the plurality of leads by conductive wires.

18. The system according to claim 15, wherein the circuit board and the first semiconductor die are electrically connected to each other by conductive bumps.

19. The system according to claim 15, wherein the first package and the second package are stacked such that the first and second semiconductor die are positioned one over the other with the adhesion member positioned between the first and second semiconductor die.

20. The system according to claim 15, wherein the encapsulant exposes the first region of each of the plurality of leads to the exterior of the first semiconductor package.

* * * * *